(12) United States Patent
Hayashi (10) Patent No.: US 9,699,916 B2
(45) Date of Patent: Jul. 4, 2017

(54) METHOD OF MANUFACTURING WIRING SUBSTRATE, AND WIRING SUBSTRATE

(71) Applicant: NGK SPARK PLUG CO., LTD., Nagoya-shi, Aichi-ken (JP)

(72) Inventor: Takahiro Hayashi, Chino (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 14/707,295

(22) Filed: May 8, 2015

(65) Prior Publication Data

US 2015/0334850 A1 Nov. 19, 2015

(30) Foreign Application Priority Data

May 13, 2014 (JP) ................................. 2014-099319

(51) Int. Cl.
*H05K 1/00* (2006.01)
*H05K 1/09* (2006.01)
(Continued)

(52) U.S. Cl.
CPC .............. *H05K 3/28* (2013.01); *H05K 1/0284* (2013.01); *H05K 3/46* (2013.01); *H05K 3/188* (2013.01);
(Continued)

(58) Field of Classification Search
CPC ....... H05K 1/0284; H05K 2201/09045; H05K 2201/09409; H05K 2201/09909;
(Continued)

(56) References Cited

U.S. PATENT DOCUMENTS 4,766,268 A * 8/1988 Uggowitzer ......... H05K 3/3452
174/256
5,324,535 A * 6/1994 Ishido ....................... G03F 7/16
427/259
(Continued)

FOREIGN PATENT DOCUMENTS

CN 103258807 A 8/2013
JP S58-188142 A 11/1983
(Continued)

OTHER PUBLICATIONS

Definition of "separate" from www.thefreedictionary.com May 19, 2016.*
(Continued)

*Primary Examiner* — Chau N Nguyen
*Assistant Examiner* — Roshn Varghese
(74) *Attorney, Agent, or Firm* — Stites & Harbison, PLLC; Jeffrey A. Haeberlin; James R. Hayne (57) ABSTRACT

A method of manufacturing a wiring substrate according to the present invention includes a step of forming a wiring layer including connection terminals on a first insulating layer; a step of forming a second insulating layer on the wiring layer and on the first insulating layer; a step of forming electrically insulative dummy portions separated from the wiring layer on the first insulating layer through patterning of the second insulating layer; a step of forming a third insulating layer on the wiring layer, on the dummy portions, and on the first insulating layer; and a step of forming openings in the third insulating layer for exposing the connection terminals in such a manner that upper end portions of the connection terminals protrude from the third insulating layer, and lower end portions of the connection terminals are embedded in the third insulating layer.

7 Claims, 6 Drawing Sheets

(51) Int. Cl.
  *H05K 3/28* (2006.01)
  *H05K 1/02* (2006.01)
  *H05K 3/46* (2006.01)
  *H05K 3/18* (2006.01)
  *H05K 3/24* (2006.01)
  *H05K 3/38* (2006.01)
  *H05K 3/40* (2006.01)

(52) U.S. Cl.
  CPC ............ *H05K 3/243* (2013.01); *H05K 3/244* (2013.01); *H05K 3/282* (2013.01); *H05K 3/381* (2013.01); *H05K 3/383* (2013.01); *H05K 3/4007* (2013.01); *H05K 3/4602* (2013.01); *H05K 3/4661* (2013.01); *H05K 2201/0959* (2013.01); *H05K 2201/09409* (2013.01); *H05K 2201/09536* (2013.01); *H05K 2201/10204* (2013.01); *H05K 2203/0307* (2013.01); *H05K 2203/058* (2013.01); *H05K 2203/0574* (2013.01); *H05K 2203/0597* (2013.01); *H05K 2203/0766* (2013.01); *Y10T 29/49156* (2015.01)

(58) Field of Classification Search
  CPC .......... H05K 2201/09881; H05K 2201/10204; H05K 2203/058; H05K 2203/0588; H05K 2203/0597; H05K 1/111; H05K 3/28; H05K 2201/09781
  See application file for complete search history.

(56) References Cited

U.S. PATENT DOCUMENTS

| | | | | |
|---|---|---|---|---|
| 5,512,712 | A * | 4/1996 | Iwata | H05K 1/0266 |
| | | | | 174/250 |
| 6,198,165 | B1 | 3/2001 | Yamaji et al. | |
| 6,228,466 | B1 * | 5/2001 | Tsukada | H01L 23/49816 |
| | | | | 174/255 |
| 6,667,190 | B2 | 12/2003 | Kung et al. | |
| 6,998,336 | B1 * | 2/2006 | Iba | H05K 3/3484 |
| | | | | 257/772 |
| 8,304,663 | B2 | 11/2012 | Ohsumi | |
| 9,040,838 | B2 * | 5/2015 | Lee | H05K 1/0296 |
| | | | | 174/255 |
| 9,066,458 | B2 * | 6/2015 | Kung | H05K 1/111 |
| 2005/0258551 | A1 * | 11/2005 | Ho | H01L 23/49816 |
| | | | | 257/786 |
| 2008/0302563 | A1 | 12/2008 | Ohsumi | |
| 2009/0027864 | A1 * | 1/2009 | Cho | H05K 3/3452 |
| | | | | 361/767 |
| 2011/0124194 | A1 * | 5/2011 | Kwon | H01L 21/0337 |
| | | | | 438/692 |
| 2013/0180772 | A1 | 7/2013 | Inoue et al. | |
| 2014/0124242 | A1 * | 5/2014 | Ito | H05K 1/111 |
| | | | | 174/250 |
| 2014/0293547 | A1 | 10/2014 | Kung | |

FOREIGN PATENT DOCUMENTS

| | | |
|---|---|---|
| JP | S59-222944 A | 12/1984 |
| JP | H04-287326 A | 10/1992 |
| JP | H04-299893 A | 10/1992 |
| JP | H07-66552 A | 3/1995 |
| JP | H08-264941 A | 10/1996 |
| JP | H11-54896 A | 2/1999 |
| JP | 3310617 B2 | 5/2002 |
| JP | 2003-30664 A | 2/2003 |
| JP | 2005-347333 A | 12/2005 |
| JP | 2006-287640 A | 10/2006 |
| JP | 5138277 B2 | 11/2012 |
| JP | 2013-149948 A | 8/2013 |

OTHER PUBLICATIONS

Japan Patent Office, Notice of Reason for Rejection issued in corresponding Application No. 2014-099319, mailed Dec. 28, 2016.
Japan Patent Office, Office Action (Decision of Rejection) issued in corresponding Application No. 2014-099319, dispatched Mar. 8, 2017.

* cited by examiner

METHOD OF MANUFACTURING WIRING SUBSTRATE, AND WIRING SUBSTRATE

CROSS REFERENCE TO RELATED APPLICATIONS

The present application claims priority from Japanese Patent Application No. 2014-099319, which was filed on May 13, 2014, the disclosure of which is herein incorporated by reference in its entirety.

BACKGROUND OF THE INVENTION

Field of the Invention

The present invention relates to a method of manufacturing a wiring substrate having a wiring layer including connection terminals, and to the wiring substrate.

Description of Related Art

In conventional manufacture of a wiring substrate, after a wiring layer including connection terminals is formed on a laminate of insulating layers and conductor layers, a solder resist layer is formed on the wiring layer and the laminate. Subsequently, openings are formed in the solder resist layer for exposing the connection terminals.

However, if the wiring layer differs from region to region in the density of disposition of wiring lines and the connection terminals, the formed solder resist layer differs in thickness from region to region. Specifically, in a region having a high density of disposition of the wiring lines and the connection terminals, the solder resist layer becomes thick, whereas, in a region having a low density of disposition of the wiring lines and the connection terminals, the solder resist layer becomes thin. Accordingly, the following faults arise: the connection terminals are not exposed from the openings formed in the solder resist layer; on the contrary, the connection terminals are excessively exposed such that the side surfaces of the connection terminals are completely exposed from the solder resist layer.

Meanwhile, in a conventionally proposed wiring substrate having no openings formed in the solder resist layer, dummy wiring lines are formed to lower the irregularities of the surface of the solder resist layer (e.g., Patent Document 1). Also, according to a conventionally proposed method of manufacturing a wiring substrate, after a mask having openings formed therein at positions corresponding to the connection terminals is formed on the solder resist layer, the solder resist layer is removed by wet blasting to expose the upper surfaces of the connection terminals (e.g., Patent Document 2).

RELATED ART DOCUMENTS

Patent Document 1 is Japanese Patent No. 3310617.
Patent Document 2 is Japanese Patent No. 5138277.

BRIEF SUMMARY OF THE INVENTION

However, although Patent Document 1 proposes to form dummy wiring lines, the dummy wiring lines are formed of an electrically conductive film. Thus, there is the risk that the dummy wiring lines cause a change in inductance of the wiring substrate. Patent Document 1 mentions that the dummy wiring lines may be formed of an electrically insulating film, but does not propose a specific manufacturing method.

Patent Document 2 discloses that the solder resist layer is removed by wet blasting; however, when wet blasting is applied to the solder resist layer, the entire surface of the solder resist layer is evenly removed. Thus, wet blasting fails to solve the problem of uneven thickness of the solder resist layer.

Also, according to the method of Patent Document 2, since only the surfaces of the connection terminals are exposed from the solder resist layer, there is the risk that the connection terminals fail to be coated with sufficient solder. Thus, when solder coated on the connection terminals is reflowed for connection to other components such as electronic components, there is the risk that poor contact occurs, resulting in a deterioration in reliability of connection to other components such as electronic components.

The present invention has been conceived to cope with the above circumstances, and an object of the invention is to provide a method of manufacturing a wiring substrate having an improved reliability of connection to other components such as electronic components, as well as the wiring substrate.

In accordance with one aspect of the invention, a method of manufacturing a wiring substrate includes: a step of forming a wiring layer including connection terminals on a first insulating layer; a step of forming a second insulating layer on the wiring layer and on the first insulating layer; a step of patterning of the second insulating layer to form electrically insulative dummy portions on the first insulating layer and separated from the wiring layer (i.e., forming electrically insulative dummy portions separated from the wiring layer, on the first insulating layer through patterning of the second insulating layer); a step of forming a third insulating layer on the wiring layer, on the dummy portions, and on the first insulating layer; and a step of forming openings in the third insulating layer for exposing the connection terminals in such a manner that upper end portions of the connection terminals protrude from the third insulating layer, and lower end portions of the connection terminals are embedded in the third insulating layer.

Thus, there can be reduced a regional difference in thickness of the third insulating layer formed on the first insulating layer caused by a regional difference in the density of disposition of the wiring lines and the connection terminals. As a result, there can be reduced variation in the amount of protrusion among the connection terminals exposed from the openings formed in the third insulating layer. Also, since upper end portions of the connection terminals protrude from the third insulating layer, reliability of connection to other components, such as electronic components, is improved. Also, since lower end portions of the connection terminals are embedded in the third insulating layer, the occurrence of faults, such as separation and falling of the connection terminals, is curtailed (i.e., restrained). Furthermore, since the dummy portions are formed of an electrically insulating material, the risk of a change in inductance of the wiring substrate caused by the dummy portions is also reduced.

In one mode, the third insulating layer is photosensitive, and in the step of forming the openings, the third insulating layer is subjected to exposure and development so as to form the openings having respective wall surfaces located closer to the connection terminals than to the dummy portions.

According to the mode of the present invention, since the third insulating layer is photosensitive, the amount of protrusion of the connection terminals and the depth of the openings can be controlled merely through exposure and development of the third insulating layer. Also, since the wall surfaces of the openings are located closer to the connection terminals than to the dummy portions, in formation of the openings through exposure and development of the third insulating layer, the dummy portions are not exposed to the interior of the openings, so that the openings in a required shape can be obtained.

In accordance with another aspect of the invention a wiring substrate includes: a first insulating layer; a wiring layer including connection terminals formed on the first insulating layer; electrically insulative dummy portions formed on the first insulating layer and separated from the wiring layer; and a third insulating layer laminated on the wiring layer, on the dummy portions, and on the first insulating layer and having openings formed therein for exposing the connection terminals; and is characterized in that upper end portions of the connection terminals protrude from the third insulating layer, and lower end portions of the connection terminals are embedded in the third insulating layer.

Thus, there can be reduced a regional difference in thickness of the third insulating layer formed on the first insulating layer caused by a regional difference in the density of disposition of the wiring lines and the connection terminals. As a result, there can be reduced variation in the amount of protrusion among the connection terminals exposed from the openings formed in the third insulating layer. Also, since upper portions of the connection terminals protrude from the third insulating layer, reliability of connection to other components such as electronic components is improved. Also, since lower portions of the connection terminals are embedded in the third insulating layer, there can be restrained the occurrence of faults such as separation and falling of the connection terminals. Furthermore, since the dummy portions are formed of an electrically insulating material, there can be reduced the risk of a change in inductance of the wiring substrate caused by the dummy portions.

As described above, the present invention can provide a method of manufacturing a wiring substrate having an improved reliability of connection to other components such as electronic components, as well as the wiring substrate.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

Embodiments of the present invention will next be described in detail with reference to the drawings. Wiring substrates according to the embodiments are mere examples, and no particular limitation is imposed thereon so long as a wiring substrate has a wiring layer including connection terminals. For example, in the following description of the embodiments, the present invention is described while mentioning a wiring substrate having a core substrate. However, the present invention can be applied to a so-called coreless wiring substrate having no core substrate. In the following description, a side to which an electronic component such as a semiconductor chip is connected is referred to as the front side, and a side to which a motherboard, a socket, or the like (hereinafter, referred to as a motherboard or the like) is connected is referred to as the back side.

Wiring Substrate

Figure 1:
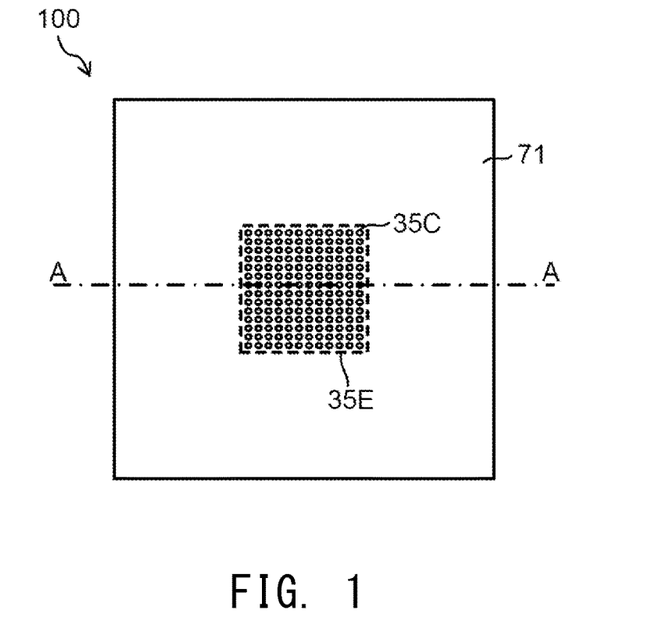
FIG. 1 is a plan view (front side) of a wiring substrate according to an embodiment of the present invention.
Figure 2:
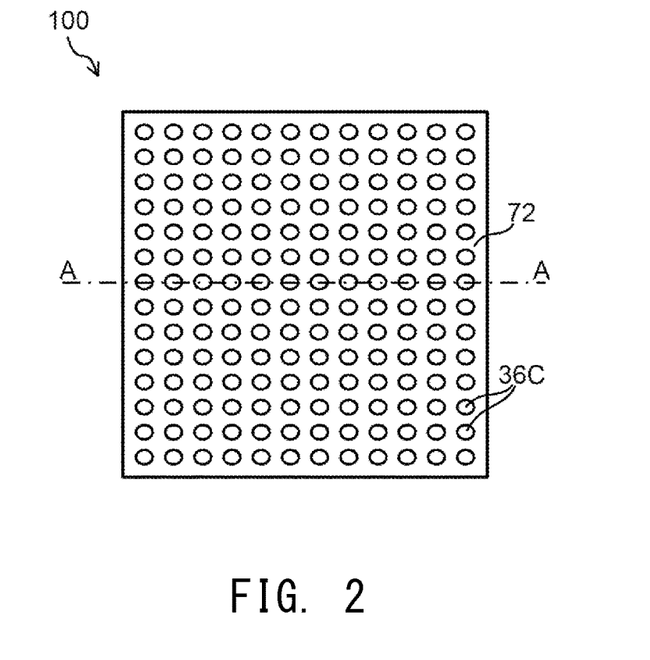
FIG. 2 is a plan view (back side) of the wiring substrate according to the embodiment.
Figure 3:
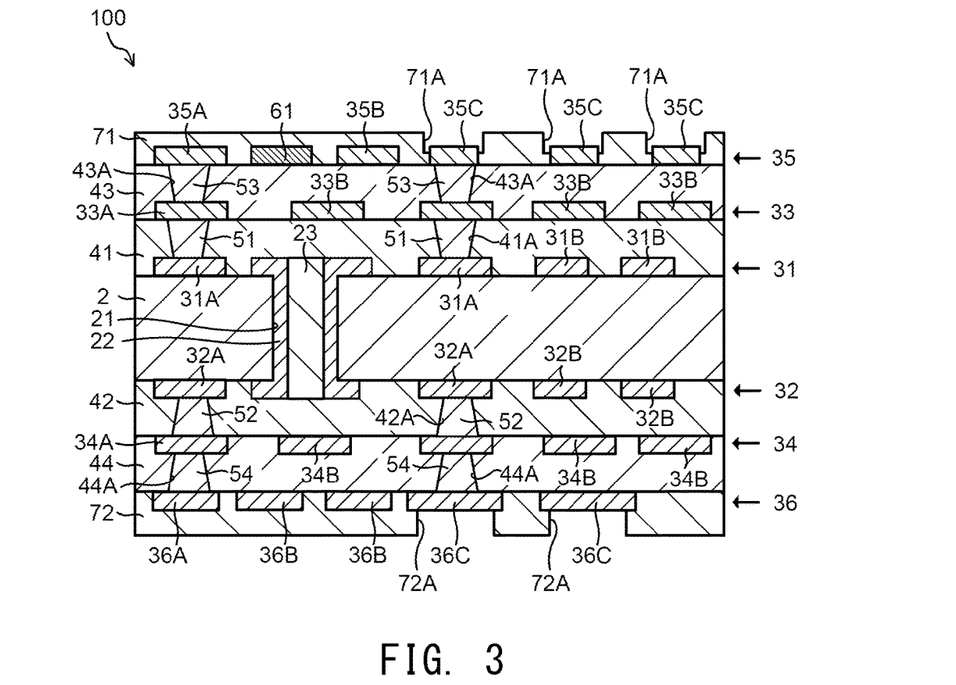
FIG. 3 is an enlarged sectional view of the wiring substrate according to the embodiment.

First, the configuration of a wiring substrate 100 according to an embodiment of the present invention will be described. FIG. 1 is a plan view showing the front side of a wiring substrate 100. FIG. 2 is a plan view showing the back side of the wiring substrate 100. FIG. 3 is a fragmentary, enlarged sectional view of the wiring substrate 100 taken along line A-A of FIGS. 1 and 2.

The wiring substrate 100 shown in FIGS. 1 to 3 includes a core substrate 2; insulating layers 41 to 44 and conductor layers 33 to 36 which are laminated on the core substrate 2; dummy portions 61; a solder resist layer 71 formed on the conductor layer 35, on the dummy portions 61, and on the insulating layer 43; and a solder resist layer 72 formed on the conductor layer 36 and on the insulating layer 44.

The insulating layer 43, the conductor layer 35, and the solder resist layer 71 correspond to the first insulating layer, the wiring layer, and the third insulating layer, respectively, in the present invention. Also, the core substrate 2, and the insulating layers 41 to 44 and the conductor layers 33 to 36 laminated on the core substrate 2 constitute a laminate.

The core substrate 2 is a plate-like resin substrate formed of, for example, a heat-resistant resin plate (e.g., bismaleimide-triazine resin plate) or a fiber-reinforced resin plate (e.g., glass-fiber-reinforced epoxy resin plate). The core substrate 2 has through holes 21 formed therein by drilling or a like process. Through hole conductors 22 are formed on the inner wall surfaces of the through holes 21, respectively, for electrically connecting a conductor layer 31 and a conductor layer 32. Furthermore, the through hole conductors 22 are filled with a resin filler 23 of epoxy resin or the like.

The insulating layers 41 and 43 and the conductor layers 33 and 35 are alternatingly laminated on the front side of the core substrate 2. Also, the insulating layers 42 and 44 and the conductor layers 34 and 36 are alternatingly laminated on the back side of the core substrate 2.

The insulating layers 41 to 44 are formed of a thermosetting resin film (e.g., epoxy resin film). The insulating layers 41 to 44 have via holes 41A to 44A formed respectively therein and extending therethrough in their thickness direction. The via holes 41A to 44A are filled with via conductors 51 to 54, respectively. The via conductors 51 electrically connect the conductor layer 31 and the conductor layer 33; the via conductors 52 electrically connect the conductor layer 32 and the conductor layer 34; the via conductors 53 electrically connect the conductor layer 33 and the conductor layer 35; and the via conductors 54 electrically connect the conductor layer 34 and the conductor layer 36.

The conductor layers 31 to 34 have via lands 31A to 34A in electrical contact with the via conductors 51 to 54, and wiring lines 31B to 34B in noncontact with the via conductors 51 to 54, respectively. The via lands 31A to 34A and the wiring lines 31B to 34B of the conductor layers 31 to 34 are formed of copper (Cu) or a like good conductor of electricity.

The conductor layer 35 (wiring layer) has via lands 35A in electrical contact with the via conductors 53, wiring lines 35B in noncontact with the via conductors 53, and connection terminals 35C. The via lands 35A, the wiring lines 35B, and the connection terminals 35C are formed of copper (Cu) or a like good conductor of electricity.

The connection terminals 35C are pads (FC pads) for flip-chip-connecting a semiconductor chip (not shown) and are provided in array (lattice) in a semiconductor mounting region 35E. The semiconductor mounting region 35E is a square region provided at a central portion of the front surface of the wiring substrate 100.

The conductor layer 36 has via lands 36A in electrical contact with the via conductors 54, wiring lines 36B in noncontact with the via conductors 54, and connection terminals 36C. The via lands 36A, the wiring lines 36B, and the connection terminals 36C are formed of copper (Cu) or a like good conductor of electricity. The connection terminals 36C are lands (LGA pads) for connecting the wiring substrate 100 to a motherboard and are arrayed on the back surface of the wiring substrate 100.

A metal plating layer may be formed on the surfaces of the connection terminals 35C and 36C. The metal plating layer is formed of a single or a plurality of layers selected from among, for example, a Ni layer, and a Sn layer, an Ag layer, a Pd layer, an Au layer, and a like metal layer. Also, coating with solder may be substituted for the metal plating layer. Furthermore, rust preventing OSP (Organic Solderability Preservative) treatment may be substituted for the metal plating layer.

The dummy portions 61 are formed on the insulating layer 43 by photocuring an electrically insulating material; for example, a photosensitive resin composition. The dummy portions 61 are formed on the insulating layer 43 in a region having a low density of disposition of the via lands 35A, the wiring lines 35B, and the connection terminals 35C of the conductor layer 35. A region having a low density of disposition is a region where the via lands 35A, the wiring lines 35B, and the connection terminals 35C are formed at a density lower than that in the other region on the insulating layer 43.

The solder resist layers 71 and 72 are formed through application of, for example, a liquid photosensitive resin composition. The solder resist layer 71 has openings 71A depressed in the thickness direction, and the solder resist layer 72 has openings 72A extending therethrough in the thickness direction. The connection terminals 35C and 36C are exposed from the openings 71A and 72A, respectively.

Figure 4A:
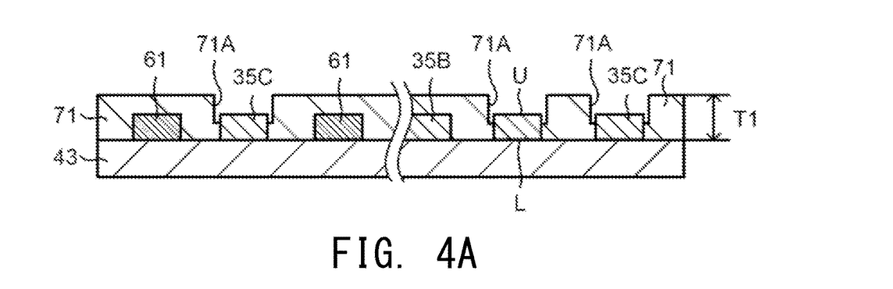
FIG. 4A is an enlarged sectional view showing connection terminals and their vicinities.

FIG. 4A is an enlarged sectional view showing the connection terminals 35C formed on the insulating layer 43. As shown in FIG. 4A, the dummy portions 61 are formed on the insulating layer 43 in a region having a low density of disposition of the conductor layer 35. Thus, there can be restrained a regional difference in the thickness T1 of the solder resist layer 71 formed on the insulating layer 43. As a result, there can be reduced variation in the amount of protrusion among the connection terminals 35C exposed from the openings 71A formed in the solder resist layer 71.

Also, since the dummy portions 61 are formed in such a manner as to be separated from the conductor layer 35, the connection terminals 35C can be exposed from the openings 71A in such a manner that upper end U portions of the connection terminals 35C protrude from the solder resist layer 71, and lower end L portions of the connection terminals 35C are embedded in the solder resist layer 71. Thus, the upper end U portions of the connection terminals 35C are sufficiently coated with solder. As a result, reliability of connection to other components such as electronic components is improved. Also, since the lower end L portions of the connection terminals 35C are embedded in the insulating layer 43, there can be restrained the occurrence of faults such as separation and falling of the connection terminals 35C.

Furthermore, since the dummy portions 61 are formed of an electrically insulating material, there can be reduced the risk of a change in inductance of the wiring substrate 100 caused by the dummy portions 61. The dummy portions 61 may be formed of the same material as that used to form the solder resist layer 71 and may be smaller in thickness than the conductor layer 35.

Figure 4B:
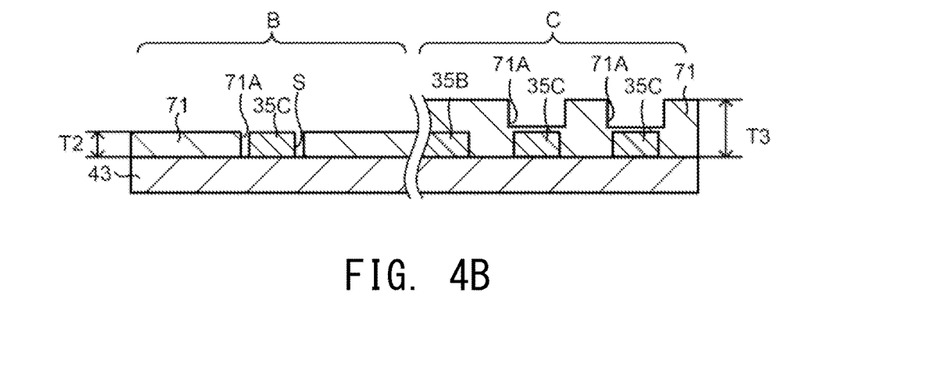
FIG. 4B is an enlarged sectional view showing connection terminals and their vicinities.

FIG. 4B is an enlarged sectional view showing the connection terminals 35C formed on the insulating layer 43 of a wiring substrate according a comparative example. As shown in FIG. 4B, in the comparative example, the dummy portions 61 are not formed on the insulating layer 43 in a region B having a low density of disposition of the conductor layer 35. Thus, the solder resist layer 71 formed on the insulating layer 43 differs in thickness from region to region. Specifically, the solder resist layer 71 is small in thickness T2 in the region B having a low density of disposition of the conductor layer 35 and is large in thickness T3 in a region C having a high density of disposition of the conductor layer 35.

As a result, the connection terminals 35C exposed from the openings 71A formed in the solder resist layer 71 vary in the amount of protrusion. Specifically, in the region B where the thickness T2 of the solder resist layer 71 is small, side surfaces S of the connection terminals 35C are completely exposed from the solder resist layer 71. In the case of complete exposure of the side surfaces S, gaps between the solder resist layer 71 and the side surfaces S of the connection terminals 35C may not be sufficiently filled with a filler such as underfill, potentially resulting in generation of voids. In the region C where the thickness T3 of the solder resist layer 71 is large, there is the risk of nonexposure of the connection terminals 35C from the openings 71A formed in the solder resist layer 71.

Method of Manufacturing a Wiring Substrate

Next, a method of manufacturing the wiring substrate 100 of the present embodiment will be described with reference to FIGS. 3 and 5 to 12. The sectional views shown in FIGS.

5 to 12 correspond to the sectional view of the wiring substrate 100 shown in FIG. 3.

There is prepared a copper clad laminate in which copper foil is affixed on the front and back surfaces of a plate-like resin substrate. The copper clad laminate is drilled at predetermined positions beforehand to form through holes which are to become the through holes 21. Desirably, after the step of forming the through holes 21, desmearing treatment is performed for removing smears from the drilled portions.

Next, electroless copper plating and copper electroplating are performed by publicly known methods to form the through hole conductors 22 on inner walls of the through holes 21, respectively, and to form copper plating layers on respective opposite surfaces of the copper clad laminate. Subsequently, the through hole conductors 22 are filled with the resin filler 23 such as epoxy resin. Furthermore, the copper plating layers formed on the respective copper foils on opposite surfaces of the copper clad laminate are etched in predetermined patterns to form the via lands 31A and 32A and the wiring lines 31B and 32B which constitute the conductor layers 31 and 32, respectively (see FIG. 5).

Figure 5:
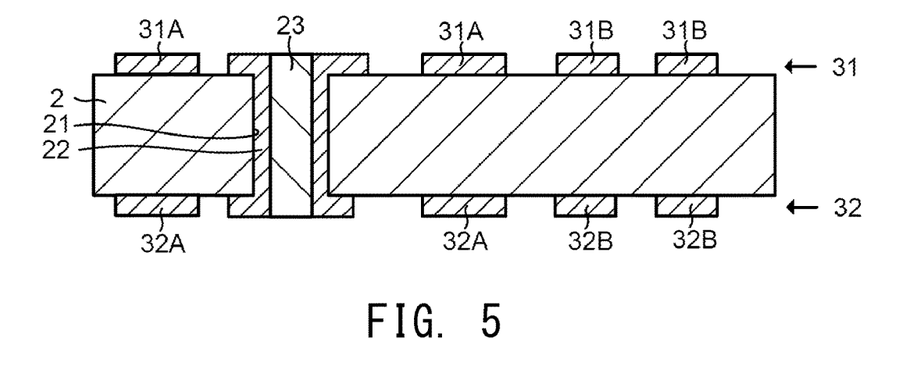
FIG. 5 is a view showing a step in the process of manufacturing the wiring substrate according to the embodiment.

Preferably, the via lands 31A and 32A and the wiring lines 31B and 32B which constitute the conductor layers 31 and 32, respectively, are roughened at their surfaces by use of a copper surface roughening agent (e.g., MECetchBOND CZ, product of MEC COMPANY LTD.).

Next, thermosetting resin films are laminated on the front and back surfaces, respectively, of the core substrate 2, followed by application of heat under vacuum for setting to form the insulating layers 41 and 42. Thus, the front and back surfaces of the core substrate 2 are covered with the insulating layers 41 and 42, respectively. Next, the insulating layers 41 and 42 are irradiated with a laser beam having a predetermined intensity and emitted from, for example, a $CO_2$ gas laser or a YAG laser to form the via holes 41A and 42A, respectively, therein (see FIG. 6).

Figure 6:
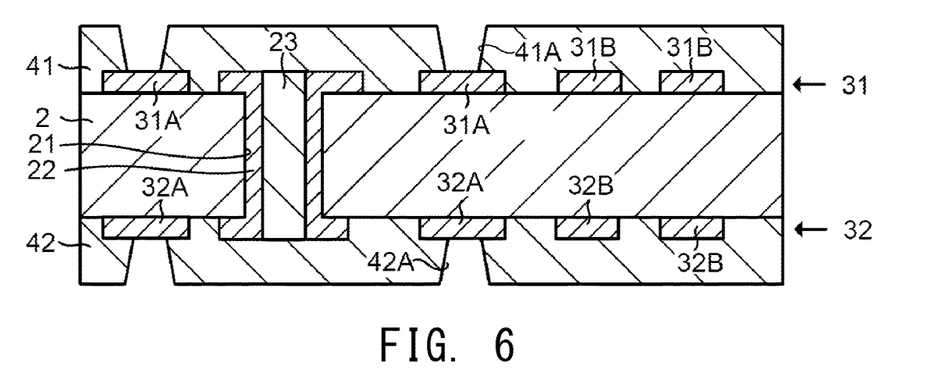
FIG. 6 is a view showing a step in the process of manufacturing the wiring substrate according to the embodiment.

Subsequently, roughening is performed on the insulating layers 41 and 42 having the via holes 41A and 42A. Notably, in the case where the insulating layers 41 and 42 contain filler, roughening is accompanied by separation of filler, and the separated filler remains on the insulating layers 41 and 42; therefore, washing with water is performed as appropriate.

Next, the via holes 41A and 42A are desmeared and outline-etched to wash the via holes 41A and 42A. Notably, air blow may be performed between washing with water and desmearing mentioned above. Even when filler separated by washing with water is not completely removed, air blow can reliably restrain remaining of filler.

Next, seed layers (first conductor layers) for electroplating are formed on the insulating layers 41 and 42, respectively. The seed layers can be formed by a publicly known method such as electroless copper plating, sputtering (PVD), or vacuum deposition.

Subsequently, resist layers of a photosensitive resin having openings are formed in a predetermined pattern on the seed layers on the insulating layers 41 and 42, respectively. Copper electroplating is performed in regions where the resist layers are not formed, thereby forming second conductor layers. As a result, the via conductors 51 and 52 are formed, and via lands 33A and 34A and wiring lines 33B and 34B which constitute the conductor layers 33 and 34, respectively, are formed. After formation of the via conductors 51 and 52, the via lands 33A and 34A, and the wiring lines 33B and 34B, the resist layers and the seed layers under the resist layers are removed (see FIG. 7).

Figure 7:
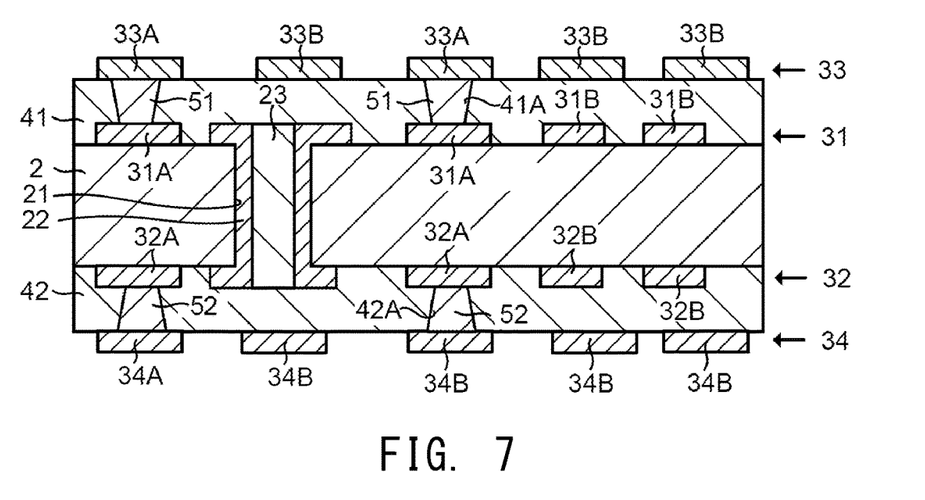
FIG. 7 is a view showing a step in the process of manufacturing the wiring substrate according to the embodiment.

Preferably, the via lands 33A and 34A and the wiring lines 33B and 34B which constitute the conductor layers 33 and 34, respectively, are roughened at their surfaces by use of a copper surface roughening agent (e.g., MECetchBOND CZ, product of MEC COMPANY LTD.).

Figure 8:
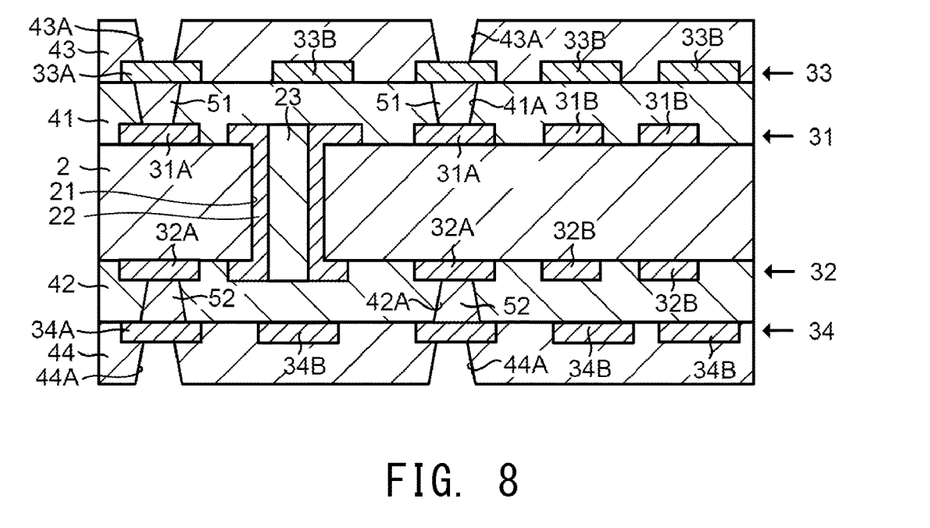
FIG. 8 is a view showing a step in the process of manufacturing the wiring substrate according to the embodiment.

Next, thermosetting resin films are laminated on the insulating layers 41 and 42, respectively, in such a manner as to cover the conductor layers 33 and 34, followed by application of heat under vacuum for setting to form the insulating layers 43 and 44.

Next, similar to the case described above with reference to FIG. 6, the insulating layers 43 and 44 are irradiated with a laser beam having a predetermined intensity and emitted from, for example, a $CO_2$ gas laser or a YAG laser to form the via holes 43A and 44A, respectively, therein (see FIG. 8).

Subsequently, roughening is performed on the insulating layers 43 and 44 having the via holes 43A and 44A. Notably, in the case where the insulating layers 43 and 44 contain filler, roughening is accompanied by separation of filler, and the separated filler remains on the insulating layers 43 and 44; therefore, washing with water is performed as appropriate.

Next, the via holes 43A and 44A are desmeared and outline-etched to wash the via holes 43A and 44A. Then, seed layers (first conductor layers) for electroplating are formed on the insulating layers 43 and 44, respectively. The seed layers can be formed by a publicly known method such as electroless copper plating, sputtering (PVD), or vacuum deposition.

Subsequently, resist layers of a photosensitive resin having openings are in a predetermined pattern formed on the seed layers on the insulating layers 43 and 44, respectively. Copper electroplating is performed in regions where the resist layers are not formed, thereby forming second conductor layers. As a result, the via conductors 53 and 54 are formed, and via lands 35A and 36A, the wiring lines 35B and 36B, and the connection terminals 35C and 36C which constitute the conductor layers 35 and 36, respectively, are formed. After formation of the via conductors 53 and 54, the via lands 35A and 36A, the wiring lines 35B and 36B, and the connection terminals 35C and 36C, the resist layers and the seed layers under the resist layers are removed (see FIG. 9).

Figure 9:
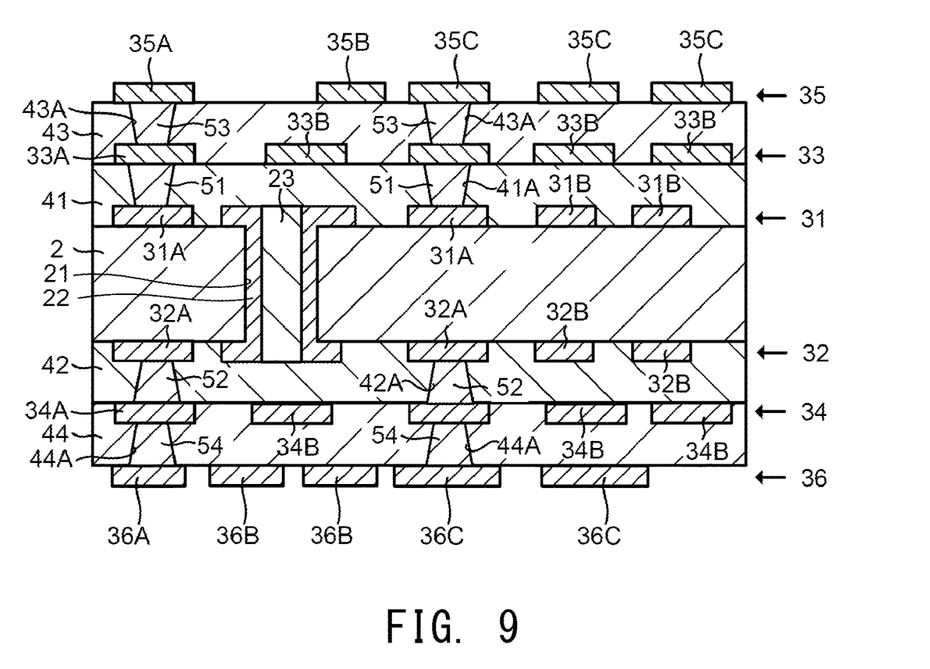
FIG. 9 is a view showing a step in the process of manufacturing the wiring substrate according to the embodiment.

Preferably, the via lands 35A and 36A and the wiring lines 35B and 36B which partially constitute the conductor layers 35 and 36, respectively, are roughened at their surfaces by use of a copper surface roughening agent (e.g., MECetchBOND CZ, product of MEC COMPANY LTD.).

Figure 10:
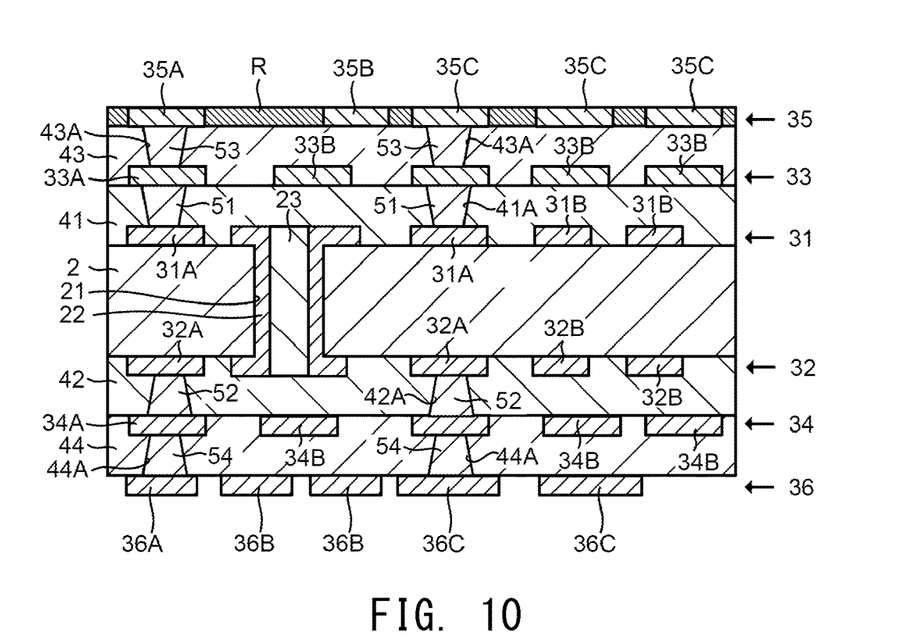
FIG. 10 is a view showing a step in the process of manufacturing the wiring substrate according to the embodiment.

Next, an electrically insulating resist material of a photosensitive resin is applied onto the conductor layer 35 and the insulating layer 43 to form a resist layer R (see FIG. 10). The resist layer R corresponds to the second insulating layer in the present invention.

Figure 11:
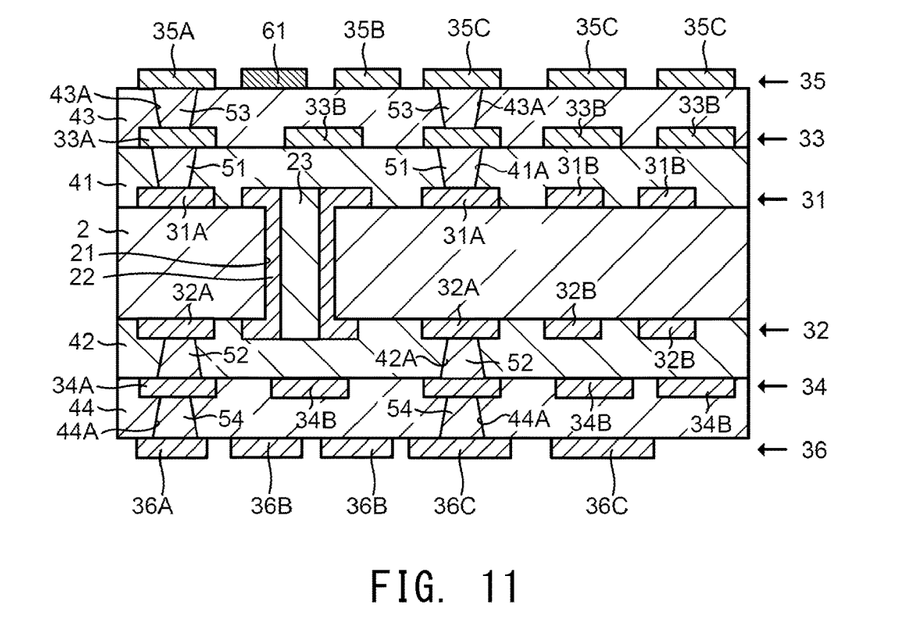
FIG. 11 is a view showing a step in the process of manufacturing the wiring substrate according to the embodiment.

Next, the resist layer R is patterned through exposure and development to form, on the insulating layer 43, the electrically insulative dummy portions 61 separated from the conductor layer 35 (see FIG. 11).

Figure 12:
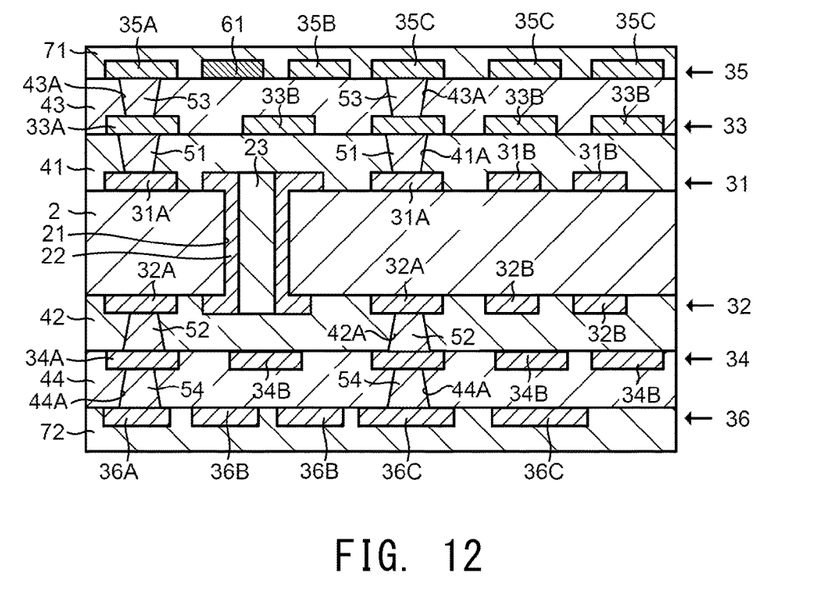
FIG. 12 is a view showing a step in the process of manufacturing the wiring substrate according to the embodiment.

Next, a solder resist material of a photosensitive resin is applied onto the conductor layers 35 and 36 and onto the insulating layers 43 and 44 to form the solder resist layers 71 and 72 (see FIG. 12). Then, openings 71A and 72A for exposing the connection terminals 35C and 36C are formed in the solder resist layers 71 and 72, respectively, through exposure and development, thereby yielding the wiring substrate 100 of the present embodiment (see FIG. 3).

In the present embodiment, metal plating layers may be formed as needed in such a manner as to cover the connection terminals 35C and 36C, respectively, exposed from the openings 71A and 72A of the solder resist layers 71 and 72. The metal plating layers are each formed of a single or a plurality of layers selected from among, for example, a Ni layer, a Sn layer, an Ag layer, a Pd layer, an Au layer, and a like metal layer. Also, coating with solder may be substituted for the metal plating layers. Furthermore, rust preventing OSP treatment may be substituted for the metal plating layer.

As described above, in the wiring substrate and the method of manufacturing the wiring substrate of the present embodiment, as shown in FIG. 4A, the dummy portions 61 are formed on the insulating layer 43 in a region having a low density of disposition of the conductor layer 35. Thus, there can be restrained a regional difference in the thickness T1 of the solder resist layer 71 formed on the insulating layer 43. As a result, there can be reduced variation in the amount of protrusion among the connection terminals 35C exposed from the openings 71A formed in the solder resist layer 71.

Also, since the dummy portions 61 are formed in such a manner as to be separated from the conductor layer 35, the connection terminals 35C can be exposed from the openings 71A in such a manner that upper end U portions of the connection terminals 35C protrude from the solder resist layer 71, and lower end L portions of the connection terminals 35C are embedded in the solder resist layer 71. Thus, the upper end U portions of the connection terminals 35C are sufficiently coated with solder. As a result, reliability of connection to other components such as electronic components is improved. Also, since the lower end L portions of the connection terminals 35C are embedded in the insulating layer 43, there can be restrained the occurrence of faults such as separation and falling of the connection terminals 35C.

Also, since the dummy portions 61 are formed of an electrically insulating material, there can be reduced the risk of a change in inductance of the wiring substrate 100 caused by the dummy portions 61. Furthermore, the solder resist layer 71 is formed through application of a liquid photosensitive resin composition. Thus, in the step of forming the openings 71A in the solder resist layer 71, the depth of the openings 71A; i.e., the amount of protrusion of the connection terminals 35C, can be controlled merely through exposure and development of the solder resist layer 71.

Another Embodiment

Figure 13:
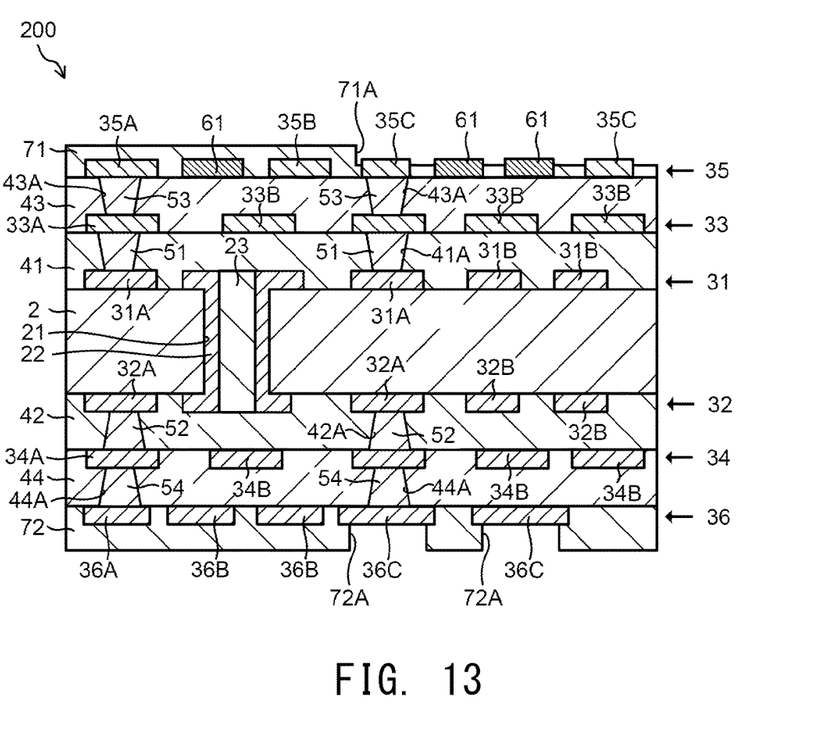
FIG. 13 is an enlarged sectional view of a wiring substrate according to another embodiment of the present invention.

FIG. 13 is an enlarged sectional view showing a wiring substrate 200 according to another embodiment of the present invention. In FIG. 13, configurational features similar to those of the wiring substrate 100 having been described with reference to FIG. 3 are denoted by like reference numerals. The above embodiment has been described while mentioning the configuration in which the connection terminals 35C are disposed, in a one-to-one correspondence, in the openings 71A formed in the solder resist layer 71. However, as shown in FIG. 13, the present invention can also be applied to the so-called NSMD (Non Solder Mask Defined) structure in which a plurality of the connection terminals 35C are disposed in a single opening 71A formed in the solder resist layer 71.

In this case, the dummy portions 61 are exposed in the opening 71A. However, since the dummy portions 61 are formed of an electrically insulating material, the dummy portions 61 are not coated with solder or the like. Thus, there can be reduced the occurrence of the following fault: the dummy portions 61 are much coated with solder or the like, whereas the connection terminals 35C are hardly coated with solder or the like. Therefore, the connection terminals 35C are sufficiently coated with solder or the like. Also, there is no occurrence of a short circuit of the connection terminal 35C with another connection terminal 35C or the wiring line 35B, which could otherwise result from solder coated on the dummy portions 61. As a result, reliability of connection to other components such as electronic components is improved. Other effects are similar to those of the wiring substrate 100 having been described with reference to FIGS. 1 to 12.

In the above embodiments, the dummy portions 61 are formed only on the insulating layer 43. However, the dummy portions 61 may be formed on the core substrate 2 or other insulating layers 41, 42, and 44.

DESCRIPTION OF REFERENCE NUMERALS

2: core substrate
21: through hole
22: through hole conductor
23: resin filler
31 to 36: conductor layer
31A to 36A: via land
31B to 36B: wiring line
35C, 36C: connection terminal
41 to 44: insulating layer
41A to 44A: via hole
51 to 54: via conductor
61: dummy portion
71, 72: solder resist layer
71A, 72A: opening
100, 200: wiring substrate

What is claimed is:

1. A method of manufacturing a wiring substrate, comprising: a step of forming a wiring layer including connection terminals on a first insulating layer; a step of forming a second insulating layer on the wiring layer and on the first insulating layer; a step of patterning of the second insulating layer to form electrically insulative dummy portions on the first insulating layer and spaced apart from the wiring layer; a step of forming a third insulating layer on the wiring layer, on the dummy portions, and on the first insulating layer; and a step of forming openings in the third insulating layer for exposing the connection terminals in such a manner that at least one opening exposes both at least one connection terminal and at least one dummy portion; wherein an upper end portion of the at least one connection terminal protrudes from the third insulating layer, and a lower end portion of the at least one connection terminal is embedded in the third insulating layer, such that for the at least one connection terminal an upper edge of the at least one connection terminal is located further from the first insulating layer than an upper surface of at least a part of the third insulating layer formed between the at least one connection terminal and an adjacent connection terminal or an adjacent dummy portion, and; wherein an upper end portion of the at least one dummy portion protrudes from the third insulating layer, and a lower end portion of the at least one dummy portion is embedded in the third insulating layer, such that for the at least one dummy portion an upper edge of the at least one dummy portion is located further from the first insulating layer than an upper surface of at least a part of the third insulating layer formed between the at least one dummy portion and an adjacent connection terminal or an adjacent dummy portion.

2. The method of manufacturing a wiring substrate according to claim 1, wherein the third insulating layer is photosensitive, and in the step of forming the openings, the third insulating layer is subjected to exposure and development so as to form the openings having respective wall surfaces located closer to the connection terminals than to the dummy portions.

3. A method of manufacturing a wiring substrate, comprising: a step of forming a wiring layer including connection terminals on a first insulating layer; a step of forming a second insulating layer on the wiring layer and on the first insulating layer; a step of patterning of the second insulating layer to form electrically insulative dummy portions on the first insulating layer and spaced apart from the wiring layer; a step of forming a third insulating layer on the wiring layer, on the dummy portions, and on the first insulating layer; and a step of forming openings in the third insulating layer for exposing the connection terminals; wherein at least one opening exposes both at least one connection terminal and at least one dummy portion; wherein the at least one connection terminal is only partially embedded in the third insulating layer such that an upper edge of the at least one connection terminal is located further from the first insulating layer than an upper surface of at least a part of the third insulating layer; and wherein the at least one dummy portion is only partially embedded in the third insulating layer such that an upper edge of the at least one dummy portion is located further from the first insulating layer than an upper surface of at least a part of the third insulating layer.

4. A wiring substrate comprising: a first insulating layer; a wiring layer including connection terminals formed on the first insulating layer; electrically insulative dummy portions formed on the first insulating layer and spaced apart from the wiring layer; and a third insulating layer laminated on the wiring layer, on the dummy portions, and on the first insulating layer and having openings formed therein for exposing the connection terminals with at least one opening exposing both at least one connection terminal and at least one dummy portion; wherein an upper end portion of the at least one connection terminal protrudes from the third insulating layer, and a lower end portion of the at least one connection terminal is embedded in the third insulating layer, such that for the at least one connection terminal an upper edge of the at least one connection terminal is located further from the first insulating layer than an upper surface of at least a part of the third insulating layer formed between the at least one connection terminal and an adjacent connection terminal or an adjacent dummy portion; and wherein an upper end portion of the at least one dummy portion protrudes from the third insulating layer, and a lower end portion of the at least one dummy portion is embedded in the third insulating layer, such that for the at least one dummy portion an upper edge of the at least one dummy portion is located further from the first insulating layer than an upper surface of at least a part of the third insulating layer formed between the at least one dummy portion and an adjacent connection terminal or an adjacent dummy portion.

5. The wiring substrate of claim 4, wherein the electrically insulative dummy portions are formed in a region of the first insulating layer having less surface area covered by the wiring layer than an other region of the first insulating layer.

6. A wiring substrate comprising: a first insulating layer; a wiring layer including connection terminals formed on the first insulating layer; electrically insulative dummy portions formed on the first insulating layer and spaced apart from the wiring layer; and a third insulating layer laminated on the wiring layer, on the dummy portions, and on the first insulating layer and having openings formed therein for exposing the connection terminals with at least one opening exposing both at least one connection terminal and at least one dummy portion; wherein the at least one connection terminal is only partially embedded in the third insulating layer such that an upper edge of the at least one connection terminal is located further from the first insulating layer than an upper surface of at least a part of the third insulating layer; and wherein the at least one dummy portion is only partially embedded in the third insulating layer such that an upper edge of the at least one dummy portion is located further from the first insulating layer than an upper surface of at least a part of the third insulating layer.

7. The wiring substrate of claim 6, wherein the electrically insulative dummy portions are formed in a region of the first insulating layer having less surface area covered by the wiring layer than an other region of the first insulating layer.

* * * * *